United States Patent [19]
Tsuji et al.

[11] Patent Number: 5,329,690
[45] Date of Patent: Jul. 19, 1994

[54] PRINTED CIRCUIT BOARD ASSEMBLING SYSTEM

[75] Inventors: Yoshihisa Tsuji, Hadano; Sigeru Ninomiya, Tokyo; Kazuo Kato, Yamato; Mamoru Kobayashi, Hadano; Akio Kojima, Hadano; Hideaki Sasaki, Hadano; Tetsuhiro Yokoyama, Hadano, all of Japan

[73] Assignees: Hitachi, Ltd.; Hitachi Computer Engineering Co., Ltd., Hadano, both of Japan

[21] Appl. No.: 987,085

[22] Filed: Dec. 7, 1992

Related U.S. Application Data

[63] Continuation of Ser. No. 541,596, Jun. 21, 1990, abandoned.

[30] Foreign Application Priority Data

Jun. 22, 1989 [JP] Japan .................................. 1-160291

[51] Int. Cl.⁵ ............................................. B23P 21/00
[52] U.S. Cl. ........................................ 29/701; 29/430;
  29/711; 29/720; 29/742; 29/760; 29/793;
  29/799; 29/783; 29/784
[58] Field of Search ................... 29/464, 467, 469, 701,
  29/711, 720, 721, 739, 742, 760, 793, 799, 771,
  783, 784, 430; 414/222; 29/407

[56] References Cited

U.S. PATENT DOCUMENTS

| | | | |
|---|---|---|---|
| 4,377,890 | 3/1983 | Miller | 29/430 X |
| 4,473,935 | 10/1984 | Tatsuura et al. | 269/47 X |
| 4,703,558 | 11/1987 | Mäkinen | 29/784 |
| 4,719,694 | 1/1988 | Herberich et al. | 29/771 X |
| 4,783,904 | 11/1988 | Kimura | 29/799 X |
| 4,821,197 | 4/1989 | Kenick et al. | 29/701 |
| 4,872,257 | 10/1989 | Wakamori et al. | 29/720 X |
| 4,884,330 | 12/1989 | Sticht | 29/710 X |

Primary Examiner—Mark Rosenbaum
Assistant Examiner—S. Thomas Hughes
Attorney, Agent, or Firm—Kenyon & Kenyon

[57] ABSTRACT

A method of supplying parts in a system for assembling a printed circuit board by mounting the parts on a substrate at corresponding predetermined positions thereof. One or more kinds of substrates and at least one group of parts, to be mounted on the corresponding substrates, are introduced into the system lot by lot. The introduced parts on one or more previously prepared parts containers are placed so as to correspond to the substrates on which the individual parts are to be mounted, thereby providing one or more sets of the parts, each set corresponding to a respective one of the substrates. The sets of parts are supplied to a parts mounting station of the system.

21 Claims, 3 Drawing Sheets

PRINTED CIRCUIT BOARD ASSEMBLING SYSTEM

This application is a continuation of U.S. patent application Ser. No. 07/541,596 filed on Jun. 21, 1990, now abandoned.

BACKGROUND OF THE INVENTION

1. Field of the Invention

The present invention relates generally to systems for assembling a printed circuit board by mounting a set of components or parts on a substrate (including a ceramic substrate), and more particularly to a system most suitable for assembling printed circuit boards, like those for a large-scale computer, in flexible manufacturing that requires a large number of complicated manufacturing stations.

2. Description of the Related Art

Heretofore it has been a common practice to use printed circuit boards for main circuits in computers, electronic equipments of control systems, and the like. For production of the individual printed circuit board of computers, for example, a CPU, memories, various interfaces, a controller, etc. are fabricated into LSI circuits, and then several kinds of such LSI circuits, along with other electronic components such as resistors, are packaged into a single unit at high density.

Usually, these kinds of printed circuit boards are required to be manufactured efficiently within a short period of time to reduce production time and also to minimize the production costs. Also it is required to accurately mount necessary parts on a substrate accurately.

In a conventional system, for assembling 100 kinds of printed circuit boards on a single parts mounting apparatus using 20 kinds of parts in all, for example, the parts mounting apparatus is equipped with a parts supply unit which is capable of supplying any of 20 kinds of the parts optionally so that any intended printed circuit board, of 100 kinds of printed circuit boards, can be assembled. This conventional system is exemplified by Japanese Utility Model Laid-Open Publication No. 72898/1986.

Figures 2, 3, 4:
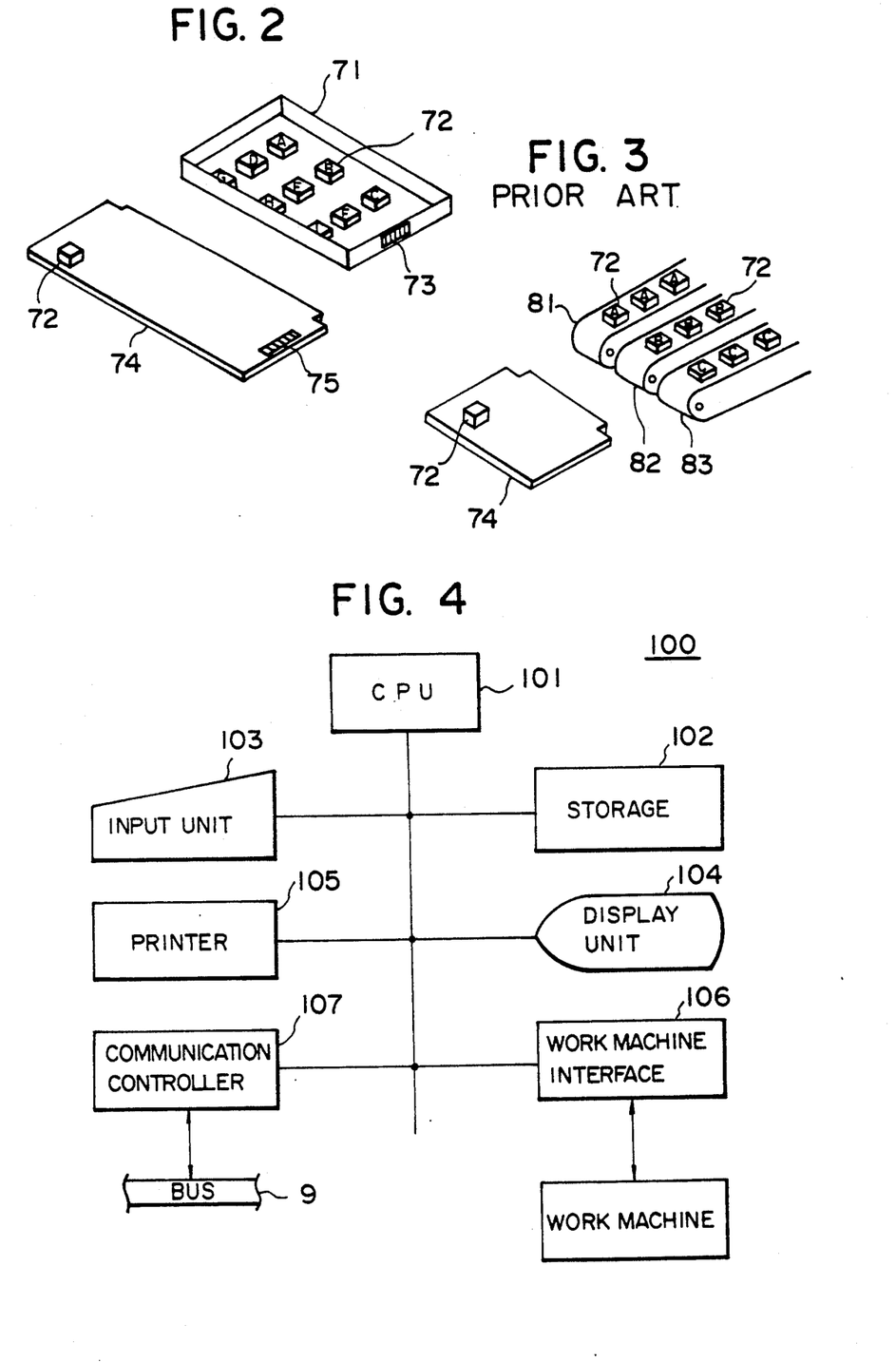
FIG. 2 is a perspective view showing a parts supplying apparatus adaptable to the system of FIG. 1.
FIG. 3 is a perspective view showing a parts mounting station in a parts mounting apparatus of a conventional system.
FIG. 4 is a block diagram showing one example of terminal hardware used in the printed circuit assembling system.

FIG. 3 is a fragmentary perspective view illustrating the manner that the parts are supplied to a parts mounting area in the parts mounting apparatus of the conventional system. Although in the conventional system, 20 kinds of parts are supplied, only three kinds of parts are illustrated in FIG. 3 for clarity. Also the parts mounting apparatus is omitted in FIG. 3 for clarity.

In FIG. 3, parts 72 are commercially available parts such as TTLs (Transistor Transistor Logic circuits); three kinds of TTLs named A, B and C, for example, are carried to the vicinity of a substrate 74 by three conveyors 81, 82, 83, respectively.

To mount the TTLs named A on the substrate 74, the part 72 is taken out from the forward end of the conveyor 81 and is then attached in a predetermined position of the substrate 74. Then the conveyor 81 is moved an amount corresponding to a single part, whereupon the next part 72, like the preceding part, is taken out from the conveyor 81 and is then attached in another predetermined position on the substrate 74. This procedure is repeated until an intended number of parts have been attached to their predetermined positions on the substrate 74.

Upon completion of mounting of all the parts, the substrate 74 of FIG. 3 is discharged to a subsequent station, and then the next substrate (generally, different from the preceding substrate in number of parts to be mounted and also in mounting positions) is supplied to the parts mounting area.

In the example of FIG. 3, the foregoing procedure is repeated to assemble 100 kinds of printed circuit boards using the three kinds of parts in total.

Therefore, to mount 20 kinds of parts in total on 100 kinds of substrates, for example, 20 conveyors are provided for supplying the 20 kinds of parts to the parts mounting station where the parts are to be mounted on the corresponding substrate.

However, with this prior arrangement, if the number of kinds of parts to be mounted on 100 kinds of substrates increases up to 10,000 kinds of parts in total, it requires 10,000 conveyors provided adjacent to the parts mounting station for supplying 10,000 kinds of parts thereto. Consequently, a gigantic, complicated parts supply apparatus would be necessary, although various countermeasures are possible.

Besides, the cost of fabricating such a huge supply apparatus is considerable and is at variance with the reality; yet real conditions cannot pliably cope with the increase and change of the kinds of parts.

The conventional system requires not only a warehouse to store therein many kinds of parts taken in by manufacturing or purchasing, but also an apparatus for taking out necessary parts from the warehouse and then placing them on the corresponding conveyors. Like the supply apparatus, either the warehouse or the apparatus still have to be complex and large-sized in order to comply with every kind of parts.

Further, the conventional system does not intend to encompass the bringing-in and storing of parts and substrates needed for assembling printed circuit boards and the preparing of the substrates as well as encompass progressing status of the assembling. Since it cannot have a real-time understanding of these facts, any possible unnecessary stop cannot be determined with ease when assembling a wide variety of kinds of printed circuit boards. As a consequence, a streamlined production is difficult to achieve, and the individual printed circuit board is difficult to manufacture in a short period of time.

In the meantime, control systems, such as factory control systems and production control systems, using a computer have recently been developed. For example, an automatic machine is located along the parts conveying line and is controlled by a computer.

However, any one of the prior control systems aims at a centralized control of the working automatic machine and conveying line, which does not necessarily meet the reality. Especially when mounting many kinds of parts, each kind in a small quantity, (e.g., 10,000 kinds of parts, each kind including only a single part) on many kinds of substrates (e.g., 100 kinds of substrates), the prior control system should preferably have carried out assembling so as to take measures suited to the situation, i.e. status of the parts and substrates on the site.

In addition, it is laborious and time-consuming to input to a computer the progressing status of manufacture of many kinds of parts and substrates. In this connection, it is possible to recognize the individual articles using bar codes. If many kinds of articles were recognized individually at every station, it would take considerable time to perform data inquiry and data transfer processing, increasing the latency of each automatic machine.

SUMMARY OF THE INVENTION

It is therefore a first object of the present invention to provide a printed circuit assembling system in which parts to be mounted on corresponding substrates can be supplied to a parts mounting station by a simple, small-sized parts supplying unit, and which is adaptable to increases and changes in the kinds of parts.

A second object of the present invention is to provide a printed circuit assembling system in which articles such as parts or substrates can be easily recognized in a short time at every station, and which maintains a real-time status of the stored articles and of progressing of the assembling, thus minimizing a possible unnecessary interruption of the parts and substrates and a possible latency of every automatic machine.

According to a first aspect of the invention, there is provided a method of supplying parts in a system for assembling a printed circuit board by mounting the parts on a substrate at corresponding predetermined positions thereof, the method comprising the steps of: introducing one or more kinds of substrates and at least one group of parts, to be mounted on the corresponding substrates, into the system lot by lot; placing the introduced parts on one or more previously prepared parts containers which correspond to the substrates on which the individual parts are to be mounted, thereby providing one or more sets of the parts, each set corresponding to a one of the substrates; and supplying the sets of parts to a parts mounting station of the system.

In the foregoing method, the parts may be handled in terms of sets in the system before being supplied to the parts mounting station. Further, the sets of parts may be supplied to the parts mounting station of the system synchronously with the corresponding substrates.

According to a second aspect of the invention, there is provided a system for assembling a printed circuit board, comprising: a substrate supplying station in which one or more substrates are to be handled; a parts supplying station in which parts to be mounted on the substrates are to be handled; a parts mounting station in which the parts supplied from the parts supplying station are to be mounted on the substrates supplied from the substrate supplying station; parts-set forming means disposed in the parts supplying station for providing one or more sets of the parts, each set corresponding to the substrates, by placing the parts, which are introduced in the parts supplying station, on one or more previously prepared parts containers which correspond to the substrates on which the individual parts are to be mounted.

In the foregoing system, preferably, parts recognizing means are disposed in the parts supplying station at one or more positions thereof for recognizing the parts in terms of sets by detecting first identifiers each peculiar to one of the parts containers. Further, substrate recognizing means, preferably, are disposed in the substrate supplying station at one or more positions thereof for recognizing the substrates by detecting second identifiers each peculiar to one of the substrates. Each of the stations, preferably, is controlled on the basis of data obtained by the parts recognizing means and the substrate recognizing means.

In the foregoing system, preferably a parts stocking means is disposed in the parts supplying station for storing the parts in terms of sets each corresponding to one of the substrates. Further, preferably, a substrate receptacle means is disposed in the substrate supplying station for storing the substrates.

In addition, the system may be equipped with a synchronous supply designating means for detecting whether at least one set of the parts and at least one substrate corresponding thereto are completed in the parts stocker and the substrate receptacle, and outputting a command for the sets of parts and the substrates to leave the parts stocker and the substrate receptacle, respectively, to supply the sets of parts and the substrates to the parts mounting station.

According to a third aspect of the invention, there is provided a system for assembling a printed circuit board, comprising: a substrate supplying station in which one or more substrates are to be handled; a parts supplying station in which parts to be mounted on the substrates are to be handled; a parts mounting station in which the parts supplied from the parts supplying station are to be mounted on the substrates supplied from the substrate supplying station; one or more automatic machines disposed in each of the stations; recognizing means disposed at an inlet side and/or an outlet side of each of the automatic machines for recognizing the substrates and the sets of parts by identifiers each peculiar to one of the substrates and the sets of parts.

In the foregoing system, parts-set forming means is disposed at an inlet port of the parts supplying station for providing one or more sets of the parts, each set corresponding to the substrates, by placing the parts, which are introduced in the parts supplying station, on one or more previously prepared parts containers which correspond to the substrates on which the individual parts are to be mounted. Preferably, each of the recognizing means at the parts supplying station are capable of recognizing the parts in terms of sets by detecting identifiers peculiar to a one of the parts containers. The parts set forming means is one of the automatic machines.

Identifier giving means, which is one of the automatic machines, is disposed at an inlet port of the substrate supplying station for giving each of the identifiers to one of the substrates as introduced in the substrate supplying station. Further, station controlling means is provided for controlling each of the stations based on data obtained by one of the recognizing means.

Preferably, each of the automatic machines includes a work machine for performing an object work, and a data processing terminal for performing data processing accompanying the operation and control of the work machine, the station controlling means including a host computer to which each recognizing means and also the data processing terminal of each automatic machine are connected.

According to a fourth aspect of the invention, a parts setting apparatus is provided for providing one or more sets of parts to be introduced in a printed circuit board assembling system by placing at least one group of parts on one or more previously prepared parts containers which correspond to one or more substrates on which the individual parts are to be mounted, the parts setting apparatus comprising: means for determining one or more parts containers to be used, each corresponding to the substrates, based on mounting data which includes the name of the printed circuit board used in a production lot, the names of the parts corresponding to the substrates, and the number of the parts, for placing the parts containers in a work area and for preparing data corresponding to each parts containers and the positions of the placements; means for extracting the parts names one after another from those of the parts to be introduced lot by lot; and means for allocating the position of the parts container, with reference to the mounting data and the data concerning each parts container and the position of the placement, while treating the extracted parts name as a key, and for placing the parts on the object parts container.

With this arrangement, assuming that the maximum number of parts to be mounted on a single substrate is 130, the parts supplying station of the parts mounting apparatus is only required to be able to supply 130 parts as the parts are set in association with the individual substrates before assembly. Accordingly, the system and apparatus of this invention can cope even with the situation where 10,000 kinds of parts in all are to be mounted on 100 kinds of substrates, without making the part conveying assembly gigantic in size.

Further, partly since the parts mounting unit and the automatic machines of preceding stations are controlled by substrate identifiers and parts identifiers and partly since the system is equipped with the status features, it is possible to operate the entire printed circuit assembling system automatically and efficiently, in association with the actual progress of the individual stations, under the control of a computer or the like.

Generally, in such a case, partly because the parts are considerably great kind and quantity, compared to the kinds of the substrate, and partly because the individual parts are relatively small in size, it is difficult to attach the identifiers such as bar codes to the parts. In this invention, the parts are identified not individually but in terms of parts containers in which each container contains a set of parts corresponding to one of the substrates and has an identifier peculiar to that individual set of parts. Therefore, since only the substrates and the parts containers are required to be recognized at each station, inquiry, transfer or other processing of data can be carried out quickly.

In addition, according to this invention, the progress status of the individual stations and other facts is available in real time, and as a result, it is possible to make a change in production priority, for example, so as to pliably cope with the situation. Consequently, it is possible to minimize the occurrences of interrupting the parts lot at a station and to minimize the waiting time until the subsequent automatic machine is completed its operation for the preceding parts lot.

The above and other advantages, features and additional objects of this invention will be manifest to those versed in the art upon making reference to the following detailed description and the accompanying drawings in which a preferred embodiment incorporating the principles of the present invention is shown by way of illustrative example.

DETAILED DESCRIPTION

An embodiment of the present invention will now be described in connection with the accompanying drawings.

FIG. 2 shows one example of a method of supplying parts to a parts mounting station. This method is a method for supplying, to the parts mounting station, parts 72 as arranged on a parts container (hereinafter also called "pallet") 71 which corresponds to a substrate 74 to which the parts 72 are to be attached. Practically, as a manufacturer makes a decision to produce one or more kinds (usually a plurality of kinds) of printed circuit boards for use in a type of computers, the manufacturer orders the necessary parts in a set and receives them that way. Perceiving this fact, the present inventors invented this method.

Specifically, upon receipt of a group of parts for a kind of computers, in a parts supplying station, the parts are placed on previously prepared pallets 71 each corresponding to a respective one of the substrates 74 to provide sets of parts corresponding to the respective substrates 74, whereupon the parts 72 are conveyed, stored, mounted, and otherwise handled in terms of sets. Identification of the parts also is performed in terms of sets via the individual pallets 71.

Several different forms of parts containers may be used in view of the operativity at individual stages in the parts supplying station. In this case, at the station, a parts container is substituted by a different one while there is no change in a set of parts (hereinafter called "parts set"). However, one and the same set of parts may be carried collectively by a single parts container or separately by a plurality of parts containers according to need; that is, each parts set should be held by one or more parts containers.

The need to replace a parts container 71 by a different one exists with LSIs (Large Scale Integrated circuits), for example. Usually, by the time they are received by a factory, LSIs have already connected individually to small-sized boards (hereinafter also called "baby boards") to facilitate checking and to protect pins of the LSIs. In this form, each LSI can be treated like another element or device, e.g. a resister. But after the baby board is removed to restore the pins, it is preferable to use parts containers which prevent the pins from any bending or other damage. So, at this stage, a parts container could be replaced by a different one.

Each parts set should at least include parts 72 to be mounted on the corresponding substrate 74, preferably in a predetermined arrangement. This arrangement should preferably be suited to the mounting of the parts at a parts mounting apparatus 3 described below. For example, the arrangement may be in the order of mounting or in association with the positions of mounting.

The parts 72 may be circuit elements such as LSIs. The parts 72 shown in FIG. 2 have the same exterior physical contour, but comprise nine kinds of LSIs which are different in interior and are named A, B, C, . . . I and which are placed in the pallet 71.

In the parts mounting apparatus, the parts 72 are mounted one by one onto the substrate 74 by means of a parts absorbing head of a non-illustrated robot.

Meanwhile, in a substrate supplying station, the substrates 74 are supplied to the parts mounting apparatus, with an identifier such as a substrate bar code 75 attached to one of the substrates to indicate its kind, its number of make, etc.

The substrate bar code 75 may be in the form of a label bearing a printed bar code and to be attached to the substrate, or may be printed in ink directly on the substrate, or may be etched on the substrate. Further, the identifiers should by no means be limited to bar codes, and may be figures, characters or symbols. Alternatively, shapes or other features each peculiar to one of the substrate may be utilized. Further, the kind, the make number, etc. may be labelled. Yet otherwise, a mere symbol such as a number meaning nothing by itself may be marked on one of the substrates and may be related with the kind, the make number, etc. of a computer.

The pallets 71 may be in the form of trays, preferably identical in size to facilitate handling. Each pallet 71, with a pallet bar code 73 indicating a parts set to be mounted on the associated substrate, is supplied to the parts mounting apparatus.

If only a single pallet cannot accommodate all of the parts to be mounted on a single substrate, all the parts may be placed in a plurality of separate pallets, and a large container (hereinafter called "magazine") may be prepared to accommodate these pallets, bearing a bar code.

As described above in connection with the substrate bar code 75, the pallet bar code 73 may be replaced by another identifier. Further, the kind, the make number, etc. of a substrate may be labelled directly on each of pallets and magazines. Yet otherwise, a mere symbol such as a number meaning nothing by itself may be marked on one of the substrates and may be related with the kind, the make number, etc. of a computer. Especially when the pallets and the magazines are used also in assembling another printed circuit board, without being discarded after a single use, it is preferred to mark mere symbols, such as numbers, each meaning nothing by itself on one of the pallets or one of the magazines, partly in order to omit the trouble of labelling pallet bar codes.

One example of a printed circuit board assembling system, in which the above-discussed parts supplying method is incorporated, will now be described in connection with FIGS. 1 and 2.

Figure 1:
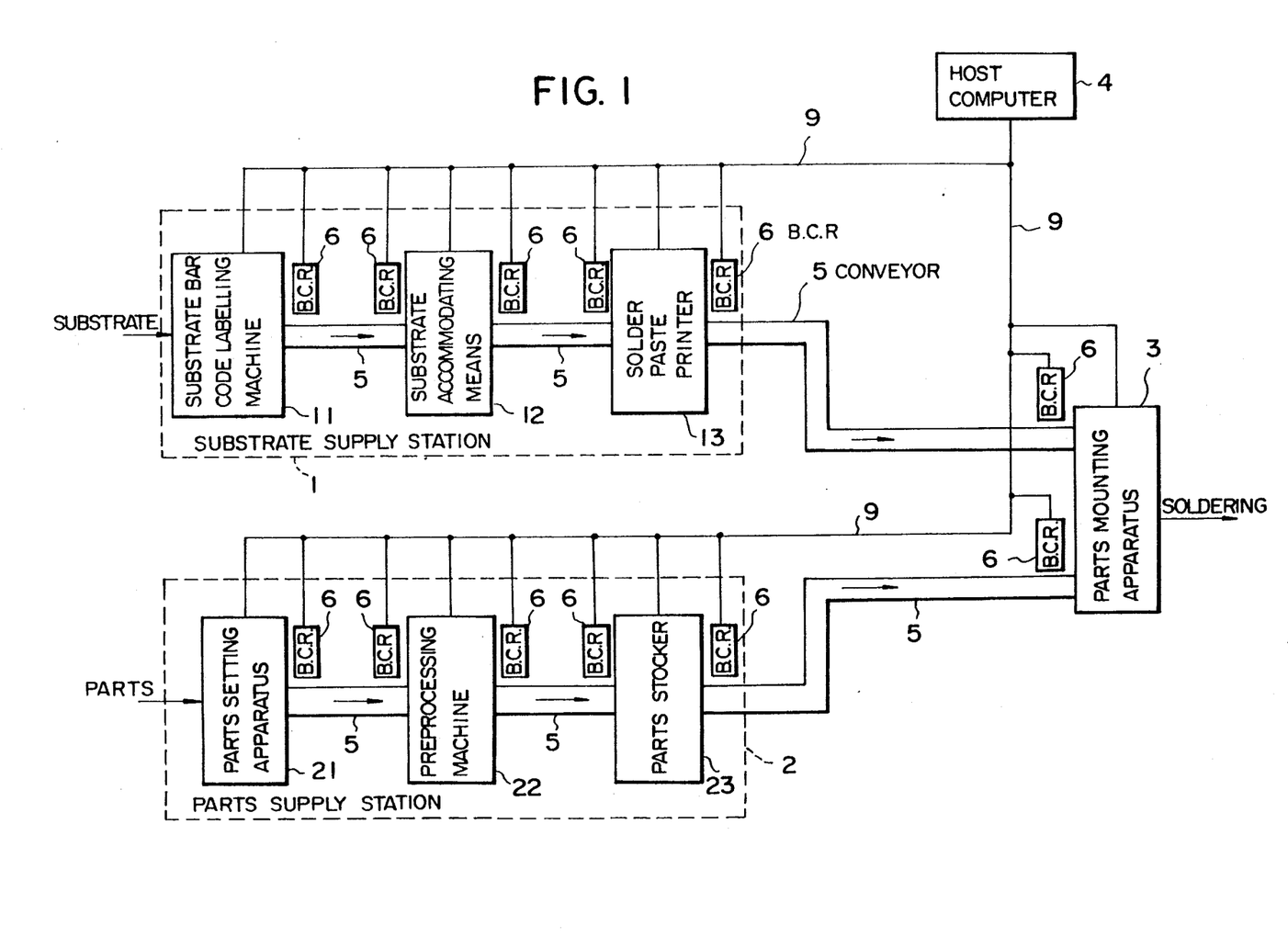
FIG. 1 is a block diagram showing a printed circuit board assembling system embodying the present invention.

As shown in FIG. 1, the system generally comprises a substrate supply station 1, a parts supply station 2, a parts mounting station 3, and a host computer 4 for management.

The substrate supply station 1 and the parts supply station 2 are connected to the part mounting apparatus 3 via conveyors 5. Inside the substrate supply station 1 and the parts supply station 2, bar code readers 6 are disposed at each inlet and outlet of every automatic machine. Each of the bar code readers 6 is connected to the host computer 4 via a bus 9 so that the read data can be inputted to the host computer 4. Also each automatic machine is connected to the host computer 4 through the bus so that the status data such as of individual automatic machines and the like can be transferred to the host computer 4, and in turn commands from the host computer 4 can be transferred to the individual automatic machines and the like.

In FIG. 1, all of the units and apparatus are interconnected by means of the conveyors 5; alternatively, however, at least a part of these conveyors 5 may be substituted by at least one alternative moving apparatus or by human power.

Although all of the bar code readers 6 are connected to the host computer 4, each of them may otherwise be connected to the control device (information processing terminal) of one of the automatic machines. Or a plurality of computers may be arranged separately. In addition, the data may be inputted manually through a keyboard or the like. In another alternative form, voice inputting may be possible.

In the substrate supply station 1, a substrate bar code labelling machine 11, a substrate accommodating means (substrate receptacle means) 12, and a solder paste printer 13, all as the automatic machines, are arranged in this order along the conveyors 5 from the input side.

The substrate bar code labelling machine 11 peels labels one at a time from a ground board and attaches the labels onto the substrates 74 successively on a first-come-first-served basis as the successive substrates 74 are introduced into the substrate bar code labelling machine 11. The labels bear respectively a succession of previously printed numbers arranged in the increasing order and are set with the substrate bar code labelling machine 11.

The substrate bar code labelling machine 11 includes a work mechanism for performing the labelling action, and a control means, to which a data processing terminal (FIGS. 4 and 5) 100 for inputting data is connected. The same data processing terminal is connected to each of other automatic machines described below in connection with FIG. 4.

In FIG. 4, the data processing terminal (hereinafter called "terminal") 100 comprises a CPU 101 for controlling the terminal system and performing various kinds of processing, a storage 102 for storing a program, data, etc. which cause the CPU 101 to perform various kinds of processing to realize various functions, an input unit 103 such as a keyboard for giving various kinds of instructions to the terminal 100 to input data, and a display unit 104 having a display device such as a CRT. The terminal 100 also comprises a printer 105 for print-outputting input data, output data, graphs, etc., a work machine interface 106 for sending, to an associated work machine (automatic machine), control data (e.g. NC control data) from another automatic machine or the host computer 4 and for receiving status information (information such as busy, end and fault), and a communication controller 107 for performing data transfer between the other terminals, the bar code reader 6 and the host computer 4 via the bus 9.

Although it is not directly connected to the terminal 100 in the illustrated embodiment, the bar code reader 6 may be connected to the terminal 100. Also a necessary input unit or the like peculiar to each work machine may be connected to the terminal 100.

The input unit 103 may be equipped with a character reader for reading characters and symbols of a slip, a written order or instruction, etc. optically or magnetically. Also it may be equipped with a mouse or the like. Alternatively, it may be equipped with a reader for reading an identifier such as a bar code printed on a slip or the like. Further, a voice input unit capable of inputting instructions, lot names, substrate names, parts names, etc. by voice.

The storage 102 is a main storage in the terminal 100; a program, data and the like to be stored in this storage are supplied thereto an auxiliary storage (not shown) such as a magnetic disk or an optical disk.

In the storage 102, a management file is provided in association with a work machine connected to the terminal 100.

The display unit 104 should preferably be a color display.

The substrate accommodating means 12 includes addressed shelves (not shown), a take-in/take-out unit (not shown) for putting the substrate 74 on and off the shelf, and the above-mentioned terminal of FIG. 4.

The substrate accommodating means 12 is a warehouse for keeping a substrate 74 therein until after the parts 72 to be mounted on this substrate 74 are placed in the parts mounting apparatus 3 via the parts supply station 2 at a desired time. For receiving a substrate, a command from the host computer 4 is received by the terminal, and then the take-in/take-out unit puts out the substrate from the shelf of the associated address, according to the instruction from the terminal, and places the same substrate on the conveyor 5. For this purpose, the storage 102 has a file including a table which shows a list of substrate names being stored and their associated addresses.

The solder paste printer 13 includes a metal mask storage portion for storing metal masks of mask patterns each corresponding to one of the substrates, a mask setting portion for setting any one of the metal masks on the substrate according to a selection instruction, a printing portion for printing solder paste on the substrate with the metal mask having been set, and the terminal 100 of FIG. 4 for performing data processing, none of these portions being shown.

Specifically, when joining the parts to the substrate 74, the solder paste printer 13 prints solder paste on the substrate 74 at their connecting positions through a mask pattern of the associated metal mask. There are various kinds of mask patterns, each of which is defined in association with one of the substrates 74 on which the solder paste is to be printed; a suitable mask pattern may be selected according to a command from the host computer 4.

This information is transferred and received by the terminal 100 of FIG. 4.

The bar code reader 6 includes a reading portion for optically reading out a bar code, a detecting portion for detecting code information from the read signal, and a transfer portion for transferring the detected code information to the adjacent automatic machine and the host computer 4 via the bus 9 (none of these portions are shown).

Like a bar code reader 240 described below in connection with FIG. 5, the portion of performing the information transfer via the bus 9 may be omitted from those to be connected directly to the terminal 100.

In the parts supply station 2, a parts setting apparatus 21, a preprocessing machine 22 and a parts stocker 23, all automatic machines, are arranged in this order along the conveyor 5 from the upstream side.

Figure 5:
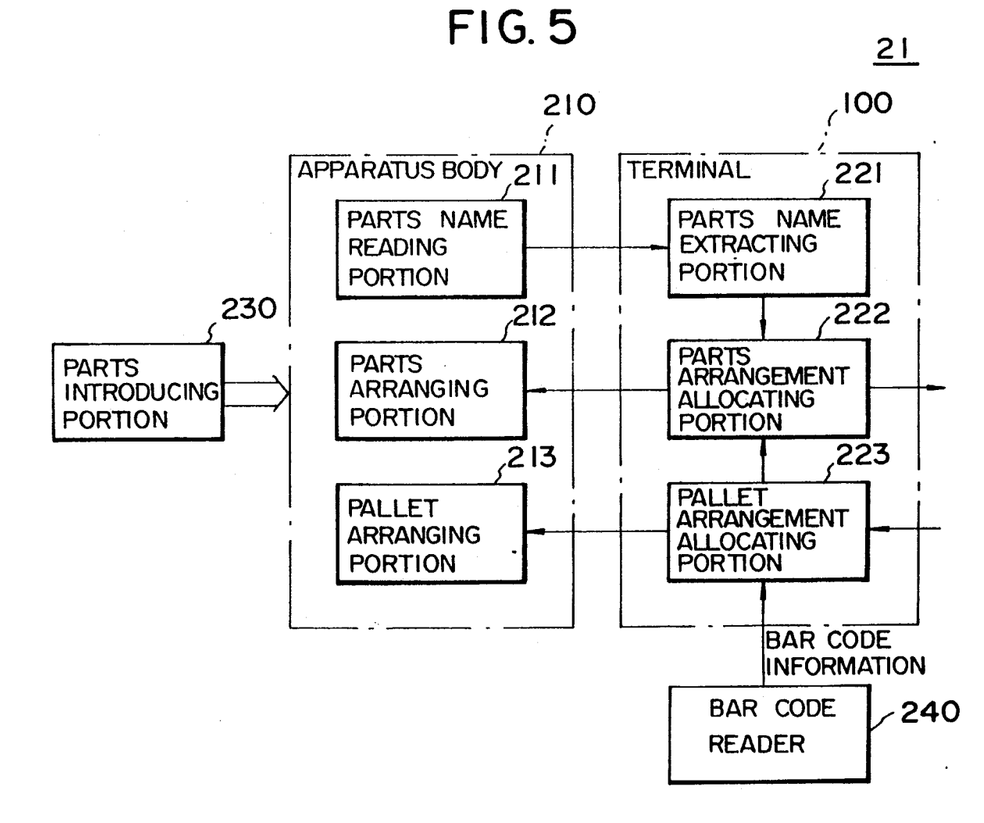
FIG. 5 is a block diagram showing a parts setting apparatus.

The parts setting apparatus 21, as shown in FIG. 5, includes a parts introducing portions 230 for introducing the parts to be set, an apparatus body 210 and the terminal 100. The parts setting apparatus 21 is capable of placing the received parts on the pallet 71 corresponding with the substrate to provide a parts set.

The parts introducing portion 230 has a function of feeding parts to be set, e.g., production lots of parts one lot by one lot to the apparatus body 210.

The apparatus body 210 includes a parts name reading portion 211 such as a camera for reading the names of parts being fed from the parts introducing portion 230, a pallet arranging portion 213 for arranging the pallets 71, on which the parts are to be placed, within a setting work area of the apparatus body 210 according to a given allocation information, and a parts arranging portion 212 for arranging the parts, of which names are recognized, on a predetermined pallet 71 according to a given allocation information.

The parts arranging portion 212 includes a parts holding device such as a vacuum chuck, and a moving mechanism for supporting the parts holding device and moving it from the parts introducing portion 230 to a parts placing position on an object pallet 71. The moving mechanism has a function of moving the parts holding apparatus freely to a designated coordinate.

The parts name reading portion 211 is located near the parts holding device and is capable of reading the names of the parts while the parts are held by the parts holding device.

The hardware of the terminal 100 is similar to that of FIG. 4. Thus the terminal 100 includes a parts name extracting portion 221, a parts arrangement allocating portion 222 and a pallet arrangement allocating portion 223, as the functions peculiar to the parts setting apparatus which are constructed by executing the program. This terminal 100 is connected to a bar code reader 240 for reading a pallet bar code on a pallet.

The parts name extracting portion 221 extracts a pattern from a signal read by the parts name reading portion 211 and further extracts from the pattern a character, a symbol or the like by a known pattern recognizing technique, thereby recognizing the parts name. This parts name information is transferred to the parts arrangement allocating portion 222.

The pallet arrangement allocating portion 223 determines one or more pallets to be used in association with each substrate, based on the loading information previously pretransferred from the host computer, such as the name of the substrate used in the production lot, the name and number of the parts placed on the associated substrate, i.e., based on the pallet bar code information read by the bar code reader 240. Then this pallet arrangement allocating portion 223 allocates these pallet arrangement positions to the pallet arranging portion 213. The pallet arrangement allocating portion 223 prepares a table which shows the association between the pallet (pallet bar code) and the substrate. This table is linked with the loading information so that the substrate and its associated pallet as well can be specified from the parts name.

This information can be held in the storage 102 of the terminal 100 as a file and can be displayed by the display unit 104 and of course can be outputted by the printer 105.

The parts arrangement allocating portion 222 determines the pallet to which the parts of the name transferred from the parts name extracting portion 221 are to be allocated based on the table of substrate pallet association linked with the loading information and on the pallet allocating information. Then the parts arrangement allocating portion 222 transfers this parts allocating information to the parts arranging portion 212 of the apparatus body 210 to place the parts on a predetermined pallet. Also it prepares a table which shows the association between the pallet (pallet bar code) and the name of the parts to be placed on the pallet.

This table should of course be associated with the substrate name and is transferred to the host computer 4.

In the illustrated embodiment, assuming that a part of the parts failed to be mounted on the pallet due to the shortage of the parts introduced into the parts arrangement allocating portion 222, this parts arrangement allocating portion 222 prepares such information (hereinafter called "parts-shortage information") about the name of the missing parts in the table or in a separate table, and then transfers the parts-shortage information to the host computer 4.

During allocating the parts arrangement, it is preferable to determine the parts arrangement in the pallet, with reference to the arrangement data which is the operation sequence information of the back-end parts mounting apparatus 3, and then to add this arrangement data to the table of association between the parts name and the pallet, so that recognition of articles can be omitted during the subsequent parts mounting. In the embodiment, this arrangement data is added.

The above-mentioned parts allocating information is transferred to the apparatus body 210, which is a work machine, via the work machine interface 106 of FIG. 4. As such instruction to the work machine is similar that in any other apparatus, repetition of the description is avoided here for clarity.

The preprocessing machine 22 removes baby boards of LSIs and restores pins of the LSIs and, for these purposes, it is equipped with a baby board remover and a pin restoring device (both not shown) as well as a terminal equipment. In the absence of any baby board and any deformation of the pins, this preprocessing machine 22 may be omitted.

To protect the pins of LSIs after restoring, the preprocessing machine 22 has a function of exchanging the pallet with a suitable one, in which case the association between the pallet (pallet bar code) and the parts is converted to the association between the parts and a new pallet. For this purpose, the preprocessing machine 22 is also equipped with a converting function at the terminal. These features are unnecessary if the pallet is not to be exchanged with another.

The parts stocker 23 is basically identical in construction with the substrate accommodating means 12, and is includes addressed shelves (not shown), a take-in/take-out unit (not shown) for putting the pallet onto and from the shelf, and the above-mentioned terminal of FIG. 4.

Specifically, the parts stocker 23 is a warehouse for keeping parts therein until after the parts to be mounted on the substrate are allowed to be placed in the parts mounting apparatus 3 via the parts supply station 2 at a desired time. For the taking-in of a pallet, a command from the host computer 4 is received by the terminal, and then the take-in/take-out unit pulls out the pallet from the shelf of the associated address, according to the instruction from the terminal, then places the same pallet on the conveyor 5. For this purpose, the storage 102 has a file including a table which shows a list of pallet bar codes being stored and their associated addresses.

The parts stocker 23 and the substrate accommodating means 12 as well have a buffering function for introducing the parts and the associated substrate into the parts mounting apparatus 3 synchronously.

In addition, the parts stocker 23 has a recovery function for interrupting the parts-shortage pallet until the missing parts are supplemented, thereby preventing the stations from any disorder such as a halt of the conveyor 5 when the pallet with the shortage of parts is moved to the parts mounting apparatus 3.

The parts stocker 23 is also capable of changing the production priority or the like during operation.

If the lacking parts is supplemented, the parts shortage information is erased so that it takes a proper table showing the correct association between the parts and the pallet.

The parts mounting apparatus 3 includes a parts holding portion for picking up the parts 72 from the pallet, i.e. the parts container 71, a moving mechanism for moving the parts 72 to the substrate 74 located at a predetermined position, and a designating portion for designating the parts loading position on the pallet and the parts loading position on the substrate 74 between which positions the parts are to be moved by the moving mechanism.

This designating portion is provided at the terminal and makes a designation to the moving mechanism according to the arrangement data.

The assembling of printed circuit boards on the system of this embodiment will now be described in connection with FIGS. 1, 2, 4 and 5.

In general, when a decision is made to produce computers of the type using printed circuit boards, a manufacturer orders substrates and parts in lots. Then the ordered substrates and parts will be received respectively in lots. In this case, the production quantity of the same type may be at least one.

Upon receipt of the substrates from a substrate maker or another production line of the manufacturer's factory, substrate bar codes 75 of FIG. 2 are attached respectively to the substrates by the substrate bar code labelling machine 11. The substrate bar codes uses different numbers one for each substrate, for example.

The individual substrate bar code represents a mere number and has no substantial meaning. Therefore, when attaching the substrate bar codes by the substrate bar code labelling machine 11, the substrate names (given in such a classification that which parts are to be mounted at which position of the substrate) are inputted to the terminal 100 of the substrate bar code labelling machine 11, and the numbers of the substrate bar codes and the substrate names are associated with one another, and this association information is further transferred to the host computer 4.

When inputting the substrate name to the substrate bar code labelling machine 11, the production lot number, the production year, month, day, time, the name of an attendant or operator, and other information also may be inputted to the labelling machine 11 and may be transferred to the host computer 4, thus enabling a finer control or management.

The substrate names or other information are inputted to the substrate bar code labelling machine 11 by the input apparatus 103 of the terminal 100. For example, they may be inputted by using a keyboard or by reading a bar code printed on a slip.

If the information such as a substrate name and a lot number is put on a substrate by printing or labelling, the information can be read by a character reader, without the necessity of human power. In this case, the character reader should be connected to the terminal.

If the received substrates have the substrate bar codes which were previously attached thereto at a substrate maker or in another production lines of the manufacturer's factory, the substrate bar code labelling machine 11 in the substrate supply station 1 may be omitted. But this in turn necessitates a function for inputting the information about the association between the substrate bar codes and the article names of the substrates to the host computer 4 via a circuit line, a magnetic tape, a floppy disk, etc.

In FIG. 1, the bar code reader 6 located at the outlet side of the substrate bar code labelling machine 11 is used to take the above-mentioned association between the substrate bar codes and the article names of the substrates.

If the association between the bar codes and the article names of the substrates is determined by the substrate bar code labelling machine 11, the bar code reader 6 may be used to check the association. Further, if the bar code reader 6 is used to detect whether the substrate has been discharged from the substrate bar code labelling machine 11, it may be used in progress management of the substrate assembling system by the host computer 4.

The substrate discharged from the substrate bar code labelling machine 11 is brought into the substrate accommodating means 12 by the conveyor 5.

The bar code reader 6 located at the inlet of the substrate accommodating means 12 reads a substrate bar code and then transfers the substrate to the substrate accommodating means 12. Of source, the bar code information may be transferred directly to the terminal 100 of the substrate accommodating means 12.

The terminal of the substrate accommodating means 12 searches for any empty shelf, and brings the substrate into the empty shelf to put and store this information in a table of association between the shelf numbers and the substrate bar codes.

Upon receipt of a take-in command from the host computer 4 with the substrate bar code as a key, the terminal of the substrate accommodating means 12 refers to the table of association between the shelf numbers and the substrate bar codes, designates the shelf number in the take-in/take-out unit to cause the take-in/take-out unit to take out the substrate and to erase the number of the associated substrate bar code of the table of association.

The bar code reader 6 located at the outlet of the substrate accommodating means 12 is used to check whether or not the taken-in substrate is a correct one. Namely, the bar code information read out by the bar code reader 6 is transferred, via the bus 9, to the host computer 4 where the bar code information is collated to perform checking.

The substrate taken from the substrate accommodating means 12 is introduced into the solder paste printer 13 by the conveyor 5. The solder paste printer 13 is needed for mounting the parts to be soldered on the substrate, and will be passed without use in the absence of the parts to be soldered.

The bar code reader 6 located at the inlet of the solder paste printer 13 reads the substrate bar code and transfers this information to the host computer 4.

The host computer 4 refers to the information of association between the substrate bar codes and the article names of substrates, which is received from the substrate bar code labelling machine 11, and converts the substrate bar code to the article name of substrate to transfer the information about the article name of substrate to the solder paste printer 13.

Upon receipt of the article name of substrate, the terminal 100 of the solder paste printer 13 designates the selection of a metal mask suitable for the substrate so that the mask setting portion sets the suitable metal mask. Using this metal mask, the printing portion prints solder paste on the substrate.

Subsequently, after the substrate bar code has been read by the bar code reader 6, which is located at the outlet of the solder paste printer 13, for the checking and the station management, the substrate is moved to the parts mounting apparatus 3 by the conveyor 5.

The parts supply station 2 will now be described.

The parts manufactured by a parts maker or another production line of the manufacturer's factory are randomly introduced into the parts introducing portion 230 of the parts setting apparatus 21 a predetermined number of lots at a time. Here in the present specification, "randomly" means in a freely scattered form, without setting articles separately at predetermined positions each for every article name. Therefore, this is particularly effective when setting parts having 10,000 different article names, for example.

These sets of randomly grouped parts are moved one set after another from the parts introducing portion 230 of the parts setting apparatus 21 to the apparatus body 210.

In the body 210 of the parts setting apparatus 21, the parts name reading portion 211 reads the parts names each printed on the surface of a respective one of the parts.

Meanwhile, at the terminal 100 of the parts setting apparatus 21, the host computer 4 receives, prior to the work of the lot, the loading information which indicates the article name or names and the number of substrates as well as the article name or names and the number of parts to be used in association with every article name of substrate.

The pallet arrangement portion 213 of the body of the parts setting apparatus 21 arranges pallets 71 (FIG. 2) for several of the substrates of lots in total, each pallet for containing the parts associated with a respective substrate, in a plane spreading over the work area of the parts arrangement portion 212.

The pallet bar codes 73 of the pallets 71 to used here have a succession of serial numbers previously attached when the pallets were produced by a parts maker or another production line of the manufacturer; the individual pallet can be repeatedly used permanently without replacement unless the bar code becomes dirty or damaged.

When arranging the pallets 71 over the work area of the body 210 of the parts setting apparatus 21, the terminal 100 of the pallet arrangement allocating portion 223 decides allocation of pallets having respective parts bar codes to substrate, prepares a table of association between the pallet bar codes and the article names of substrates, and then transfers this table to the host computer 4. The pallet bar codes can be read by the bar code reader 240.

As in the parts setting apparatus 21, the parts name reading portion 211 reads the parts name from the foregoing information, the parts arrangement allocating portion 222 searches for the article name of the substrate using the parts and then transports the parts onto the pallet 71 allocated for the article name of the substrate, in a manner like the pick-and-place action of a robot.

Likewise, upon completion of transportation of all parts introduced in the parts setting apparatus 21, the parts are thus set on the pallets each allocated for the name of a respective one of the substrates at the parts setting apparatus 21. This setting will hereinafter also be called "kit setting".

At the parts mounting apparatus 3, the parts may be moved successively onto the part container from the end thereof, and the total length of movement of a robot during this setting may be reduced to a minimum. Namely, if the arrangement order is predetermined to optimize the setting the host computer 4, and if this arrangement order information is transferred from the host computer 4 to the parts setting apparatus 21, when the parts names are read by a camera to discriminate, prior to the placing, the parts setting apparatus decides as to whether or not to place the parts at which positions of the parts container, thus improving the rate of production.

In FIG. 1, the bar code reader 6 located at the outlet of the parts setting apparatus 21 may be also used for the bar code reader 240 for reading the pallet bar codes. Or the bar code reader 240 may be provided independently of the bar code reader 6 and may be used for checking and progress management.

The kit-setting pallet 71 is introduced into the preprocessing machine 22 via the conveyor 5.

The preprocessing machine 22 is capable of restoring the pins of the parts, cutting any unnecessarily long pin, removing baby boards off the parts which had been soldered to the baby boards, when received, to facilitate checking, and checking the interpin distances and shapes of the pins.

If these processes are not necessary, the preprocessing machine 22 may be omitted. The bar code reader 6 located at the inlet side of the preprocessing machine 22 reads the pallet bar codes 73 and transfers the read number to the host computer 4. The host computer 4 transfers the article name of the substrate associated with the number to the terminal 100 of the preprocessing machine 22. The contents, conditions and other information of work for every article name of the substrate may be stored in the storage 102 of the terminal 100 of the preprocessing machine 22; the preprocessing machine 22 performs the processes according to the stored contents of the work as the article name of the substrate is transferred to the preprocessing machine 22.

The bar code reader 6 located at the outlet of the preprocessing machine 22 may be used for progress management, for example.

The parts may be shifted from the pallet 71 to another pallet having a different shape, depending on the results of the processes which are performed by the preprocessing machine 22. In that case, the pallet bar code 73 may be replaced by another pallet bar code according to the same concept as previous, and in such event, a table of association between the old pallet bar codes 73 and new pallet bar codes should be transferred to the host computer 4.

In this embodiment, the operation goes forward without replacement of any parts container or pallet with another.

The pallet 71 discharged from the preprocessing machine 22 is moved to the parts stocker 23 via the conveyor 5. The parts stocker 23 keeps the pallet 71 containing the parts associated with a single substrate, until the substrate associated with the parts is received by the substrate accommodating means 12.

The bar code reader 6 at the inlet of the parts stocker 23 reads the pallet bar code and transfers it to the parts stocker 23 via the host computer 4. Also in this case, the pallet bar code may be directly transferred to the parts stocker 23.

The parts stocker 23 searches for any empty shelf, and brings the pallet 71 into the empty shelf to put and store this information in a table of association between the shelf numbers and the pallet bar codes.

Upon receipt of a take-in command from the host computer 4 with the substrate bar code as a key, the terminal of the parts stocker 23 refers to the table of association between the shelf numbers and the pallet bar codes, designates the shelf number in the take-in/take-out unit to cause the take-in/take-out unit to take out the parts container and to erase the number of the associated substrate bar code of the table of association.

The bar code reader 6 located at the outlet of the parts stocker 23 may be used to check whether or not the taken-in pallet is a correct one, and may also be used for progress management.

The pallet 71 taken from the part stocker 23 is introduced into the parts mounting apparatus 3 via the conveyor 5.

As is apparent from the foregoing description, when the substrate of an article name is taken in the substrate accommodating means 12 and when the pallet 71 containing the parts to be mounted on that substrate is taken in the parts stocker 23, the substrate 74 and the parts container 71 are placed into the parts mounting apparatus 3 in response to a take-out command issued from the host computer 4 to the substrate accommodating means 12 and the parts stocker 23.

Two bar code readers 6 located at the inlet of the parts mounting apparatus 3 reads a substrate bar code 75 and a pallet bar code 73, respectively, and transfer these data to the host computer 4.

From the information received from the substrate bar code labelling machine 11 about the association between the article name of substrate and the substrate bar code, and also from the table received from the parts setting machine 21 and showing the association between the pallet bar code and the article name of the substrate, the host computer 4 checks whether the substrate and the pallet bar codes received from the two bar code readers 6 are associated correctly or not. If they are in correct association with each other, the host computer 4 transfers the mounting data for the article name of substrate to the parts mounting apparatus 3.

In accordance with the mounting data, the parts mounting apparatus 3 mounts the parts 72 on the pallet 71 one after another onto the substrate 74. This mounting may be simply mounting the parts on solder paste, or may include preliminarily attaching with an adhesive, or may include inserting the pins of the parts into holes on the substrates.

With all the parts thus mounted on it, the substrate is conveyed to the next station, e.g., a soldering station.

Meanwhile, the pallet 71 is collected upon completion of the parts mounting and can be reused at the parts setting apparatus 21. The used pallet 71 could be disposed without reusing; this requires the trouble of labelling an identical pallet bar code 73 on a new pallet 71.

Until now in the description, the pallet 71 has been regarded as a single container for accommodating all the parts associated with a single substrate. Alternatively all the parts associated with a single substrate are accommodated by a plurality of pallet 71. Otherwise, all the parts associated with more than one substrate may be accommodated by a single parts container.

In the foregoing embodiment, the parts are kept in the parts stocker in terms of pallets 71. But a plurality of pallets may be accommodated in a small conveyable shelf-like container (hereinafter also called "magazine"); then the parts may be conveyed in terms of magazines.

This magazine is particularly useful when the parts associated with a single substrate are to be accommodated separately in more than one pallet or when a number of pallets are to be kept collectively.

In the illustrated embodiment, each of the automatic machines includes a work unit for performing its object work, and a terminal connected to the host computer 4 via the bus 9 for processing various kinds of information relevant to the work. Further, one or two bar code readers are located along the conveyor for checking the flow of articles and recognizing the articles.

Accordingly, the current status of the substrate and the associated parts at the station is inputted to the host computers at real time. In this case, since many kinds of parts can be recognized with the pallet bar code 73 of the parts container 71 being treated as the key, the information can be transferred to the host computer 4 simply in a short time. Therefore real-time inputting can be performed almost completely.

As a consequence, the progress status of the station can be grasped accurately and quickly to minimize the occurrences of possible unnecessary stay of the substrate and parts, realizing a effective production.

Further, these data can be obtained with ease as a transfer request is given from the input unit of the individual terminal to the host computer, and the obtained data can be seen on the display unit. Therefore, the status of another station can be seen from the site of production so that the operator can make a countermeasure ahead of time to cope pliably with various changes or alterations.

In this embodiment, because various kinds of management data prepared based on the article flow at the production side are linked with the design and production information of the host computer, the synchronous supply of the substrate and the associated parts can be performed with accuracy.

This invention should by no means be limited to the illustrated example. For example, the automatic machines may be changed in number and construction, depending on the kind of work. Various checking devices, for example, may be added.

Besides, another printed circuit board mounting system, for example, may be connected to the back-end of the illustrated system. Further, the illustrated system may be used as a part of a production control system of the whole factory.

In this embodiment, a unit for attaching bar codes to pallets may be added to the part supplying station or its exterior.

The system according to this invention has the following advantageous results:

1) Since the parts can be set into kit or kits, it is possible to minimize the size of the parts supply station even when handling many kinds of parts, each kind in a small quantity.

2) The status which the substrate is taken into the substrate accommodating means and the status which the parts are taken into the parts accommodating means can be recognized at real time with use of a computer or the like, any article is prevented from staying in the substrate accommodating means or the parts stocker for an unnecessarily elongated time. Therefore it is possible to reduce the size of either the substrate accommodating means or the parts stocker to save the space.

3) Since the progress status of each station in the system can be grasped at real time by utilizing identifiers such as bar codes, the entire assembling period of time can be shortened.

What is claimed is:

1. A system for assembling a printed circuit board, comprising:
   (a) a substrate supplying station supplying a plurality of substrates received from outside the system along with information defining parts to be assembled on the substrates;
   (b) a parts supplying station supplying a plurality of parts received from outside the system, which plurality of parts are to be mounted on the plurality of substrates including:
      (i) a plurality of parts containers, wherein each of said plurality of substrates has associated therewith one of said plurality of parts containers; and
      (ii) a means using parts selected from said plurality of parts received from outside the system, which are to be mounted on the plurality of substrates, based on said information defining parts to be assembled on the substrates, for forming a set of parts for one of said plurality of substrates by placing a subset of said plurality of parts in the parts container associated with said one of said plurality of substrates; and
   (c) a parts mounting station receiving said set of parts from said parts supplying station, receiving said one of said plurality of substrates from said substrate supplying station and mounting said set of parts on said one of said plurality of substrates.

2. The printed circuit board assembling system according to claim 1, wherein said set forming means further provides a separate set of parts for each of said plurality of containers and wherein said parts supplying station further comprises means for recognizing each of the separate sets of parts disposed in said parts supplying station, wherein each of the plurality of parts containers has a unique container identifier whereby said parts set recognizing means detects said unique container identifier.

3. The printed circuit board assembling system according to claim 2, further comprises means for recognizing each of the plurality of substrates disposed in said substrate supplying station, wherein each of said plurality of substrates further comprises a unique substrate identifier whereby said substrate recognizing means detects said unique substrate identifier.

4. The printed circuit board assembling system according to claim 3, further comprising a means for controlling said parts supplying, said parts mounting and said substrate supplying stations based on information obtained by said parts recognizing means and said substrate recognizing means, whereby said controlling means receives operating information concerning said parts supplying, said parts mounting and said substrate supplying stations, converts the operating information into data necessary to operate said parts supplying, said parts mounting and said substrate supplying stations and supplies said data to each of said parts supplying, said parts mounting and said substrate supplying stations.

5. A printed circuit board assembling system according to claim 2, in which an identifier for a container is a bar code attached to said container.

6. The printed circuit board assembling system according to claim 1, further comprising means for recognizing each of said plurality of substrates disposed in said substrate supplying station, wherein each of said plurality of substrates further comprises a unique substrate identifier whereby said substrate recognizing means detects said unique substrate identifier.

7. A printed circuit board assembling system according to claim 6, in which an identifier for a substrate is a bar code attached to said substrate.

8. The printed circuit board assembling system according to claim 1, further comprising a means for stocking the plurality of parts disposed in said parts supplying station, said stocking means storing the plurality of parts in a plurality of sets of parts, each set of parts being provided in a one to one correspondence to the plurality of substrates.

9. The printed circuit board assembling system according to claim 8, further comprising a substrate receptacle disposed in said substrate supplying station storing the plurality of substrates.

10. The printed circuit board assembling system according to claim 9, further comprising a means for detecting whether said set of parts for said one of said plurality of substrates is stored in said parts stocking means and whether each of said plurality of substrates is stored in said substrate receptacle, wherein said detecting means outputs a command for the set of parts to be output from said parts stocking means and said one of said plurality of substrates to be output from said substrate receptacle to said parts mounting station.

11. The printed circuit board assembling system according to claim 1, further comprising a substrate receptacle disposed in said substrate supplying station storing the plurality of substrates.

12. A system for assembling a printed circuit board, comprising:
(a) a substrate supplying station supplying a plurality of substrates received from outside the system, wherein each of said plurality of substrates has a unique substrate identifier;
(b) a parts supplying station supplying a plurality of parts received from outside the system, wherein the plurality of parts are to be mounted in the plurality of substrates, and including:
(i) a means for forming a separate set of parts for each of the plurality of substrates, based on predetermined information regarding what parts are to be mounted on each of the plurality of substrates; and
(ii) a plurality of parts containers each for storing one of said separate sets of parts corresponding to said plurality of substrates, wherein said forming means places each set of the plurality of parts in a separate parts container of the plurality of parts containers, in accordance with a substrate of the plurality of substrates on which the set of parts is to be mounted;
(c) a parts mounting station receiving the plurality of sets of parts from said parts supplying station, receiving the plurality of substrates from said substrate supplying station and mounting one of said separate sets of parts on a corresponding substrate.

13. A printed circuit board assembling system according to claim 12, wherein said forming means further comprises:
a) a means for receiving said predetermined information, wherein said predetermined information has the form of externally given mounting information including a name of a printed circuit board to be assembled, and names and numbers of parts to be mounted on each of the plurality of substrates;
b) a means for determining, based on said mounting information, a correspondence between the plurality of parts containers and the plurality of substrates for indicating on which parts container of the plurality of parts containers the parts to be mounted on which substrate should be mounted;
c) an operation area in which the plurality of parts containers are placed for mounting a set of parts on said parts containers;
d) a means for placing the plurality of containers on which sets of parts are to be mounted, in said operation area;
e) a means for preparing correspondence information indicating the correspondence between each container placed in said operation area and the position of each container in the operation area;
f) a means for extracting a name of each of the plurality of parts supplied to the parts supplying station;
g) a means for retrieving said mounting information and the position of the plurality of parts containers by using the name extracted as a key; and
h) a means for placing a set of the parts in a particular parts container corresponding to a substrate on which the set of parts is to be mounted according to a result of the retrieval by said means for retrieving.

14. The printed circuit board assembling system according to claim 12, wherein each of the plurality of containers further comprises a unique container identifier, whereby each of the plurality of sets of parts is recognizable by detecting the unique container identifier of the container with which the set of parts is associated.

15. A printed circuit board assembling system according to claim 14, in which said identifiers are bar codes.

16. The printed circuit board assembling system according to claim 12, further comprising a means for producing the unique substrate identifiers, wherein said substrate supplying station further comprises an input at which said producing means is disposed giving a unique substrate identifier to each of the plurality of substrates as they are received in said substrate supplying station.

17. A printed circuit board assembling system according to claim 16, in which said identifiers are bar codes.

18. The printed circuit board assembling system according to claim 12, further comprising means for recognizing the substrates and the sets of parts by identifiers each peculiar to the substrates and the sets of parts, and a station controlling means for controlling each of said parts supplying, said parts mounting and said substrate supplying stations based on data obtained by said recognizing means.

19. A printed circuit board assembling system according to claim 18, wherein said substrate supplying station comprises a substrate automatic machine, said parts supplying station comprises a parts automatic machine and said parts mounting station comprises a mounting automatic machine, wherein each of said automatic machines includes a work machine for performing an object work, and a data processing terminal for performing data processing accompanying the operation control of said work machine, said station controlling means including a host computer to which said recognizing means and also said data processing terminal of each of said automatic machine are connected.

20. A system for assembling a printed circuit board comprising:
   (a) a substrate supplying station in which one or more substrates are to be handled;
   (b) a parts supplying station in which parts to be mounted on the substrate are to be handled;
   (c) a parts mounting station in which the parts supplied from said parts supplying station are to be mounted on the substrates supplied from said substrate supplying station;
   (d) one or more automatic machines disposed in each of said stations;
   (e) parts-set forming means, as one of said automatic machines disposed at an inlet port of said parts supplying station for providing one or more sets of parts, each set of parts corresponding to one of the substrates supplied in said substrate supplying station, and placing parts selected for a set of parts, which are introduced in said parts supplying station, on one of a previously prepared plurality of parts containers so as to correspond to the substrate on which the selected parts of said set of parts are to be mounted;
   (f) recognizing means, disposed at an inlet side and/or an outlet side of each of said automatic machines, for recognizing the substrates and the sets of parts by identifiers each peculiar to the substrates and the sets of parts;
   (g) each of said recognizing means at said parts supplying station being capable of recognizing the parts in terms of sets formed by said parts set forming means by detecting identifiers each peculiar to a respective one of said parts containers;
   (h) identifier giving means, as one of said automatic machines, disposed at an inlet port of said substrate supplying station for giving identifiers to each of the substrates introduced in said substrate supplying station; and
   (i) station controlling means for controlling each of said stations based on data obtained by a respective one of said recognizing means.

21. A printed circuit board assembling system according to claim 20, in which each of said automatic machines includes a work machine for performing an object work, and a data processing terminal for performing data processing accompanying the operation control of said work machine, said station controlling means including a host computer to which each said recognizing means and also said data processing terminal of each said automatic machine are connected.

* * * * *

UNITED STATES PATENT AND TRADEMARK OFFICE
CERTIFICATE OF CORRECTION

PATENT NO. : 5,329,690
DATED : July 19, 1994
INVENTOR(S) : Yoshihisa Tsuji et al.

It is certified that error appears in the above-indentified patent and that said Letters Patent is hereby corrected as shown below:

| Column | Line  | |
|--------|-------|---|
| 1      | 34-35 | After "substrate" delete "accurately". |
| 1      | 40    | Change "20 kinds of the" to --the 20 kinds of--. |
| 1      | 41    | Delete "optionally". |
| 2      | 24    | After "with" delete "the". |
| 3      | 31    | Before "one" delete "a". |
| 4      | 36    | Before "one" delete "a". |
| 6      | 23    | Delete "a respective". |
| 6      | 66    | Change "non-illustrated robot" to --robot (not shown)--. |

UNITED STATES PATENT AND TRADEMARK OFFICE
CERTIFICATE OF CORRECTION

PATENT NO. : 5,329,690
DATED : July 19, 1994
INVENTOR(S) : Yoshihisa Tsuji et al.

It is certified that error appears in the above-indentified patent and that said Letters Patent is hereby corrected as shown below:

| Column | Line | |
|---|---|---|
| 10 | 39 | Change "pretransferred" to --transferred--. |
| 11 | 58 | Change "then" to --and--. |
| 12 | 7 | Change "is" to --are--. |
| 20 | 6 | After "information" insert --,--. |

Signed and Sealed this

Twenty-eight Day of February, 1995

Attest:

BRUCE LEHMAN

Attesting Officer       Commissioner of Patents and Trademarks